(12) United States Patent
Mileo et al.

(10) Patent No.: US 8,001,808 B2
(45) Date of Patent: Aug. 23, 2011

(54) DISASSEMBLABLE BURNER FOR A VAPOR DEPOSITION PROCESS

(75) Inventors: Antonio Mileo, Ferrara (IT); Andrea Demergazzi, Milan (IT); Sergio Pellegrini, Milan (IT)

(73) Assignee: Prysmian Cavi E Sistemi Energia S.R.L., Milan (IT)

( * ) Notice: Subject to any disclaimer, the term of this patent is extended or adjusted under 35 U.S.C. 154(b) by 764 days.

(21) Appl. No.: 10/496,649

(22) PCT Filed: Nov. 26, 2001

(86) PCT No.: PCT/EP01/13701
§ 371 (c)(1),
(2), (4) Date: Nov. 4, 2004

(87) PCT Pub. No.: WO03/045860
PCT Pub. Date: Jun. 5, 2003

(65) Prior Publication Data
US 2005/0061036 A1   Mar. 24, 2005

(51) Int. Cl.
*C03B 37/018* (2006.01)
(52) U.S. Cl. ............ 65/529; 65/531; 239/423; 239/418; 239/548
(58) Field of Classification Search .................... 65/529, 65/531; 239/423, 418, 548, 240
See application file for complete search history.

(56) References Cited

U.S. PATENT DOCUMENTS

| 3,698,936 A | 10/1972 | Moltzan |
| 4,474,593 A * | 10/1984 | Andrejco et al. ............ 65/415 |
| 4,604,118 A * | 8/1986 | Bocko et al. ............ 65/416 |
| 4,810,276 A | 3/1989 | Gilliland |
| 5,922,100 A | 7/1999 | Cain et al. |
| 6,736,633 B1 * | 5/2004 | Dawson-Elli et al. ........ 431/328 |

FOREIGN PATENT DOCUMENTS

| EP | 0 978 491 A2 | 2/2000 |
| EP | 0 978 492 A1 | 2/2000 |
| WO | WO 00/07949 | 2/2000 |
| WO | WO 01/49616 A1 | 7/2001 |

* cited by examiner

*Primary Examiner* — John Hoffmann
(74) *Attorney, Agent, or Firm* — Finnegan, Henderson, Farabow, Garrett & Dunner, L.L.P.

(57) ABSTRACT

A burner for a vapor deposition process has a cylindrical central gas passage and a plurality of external gas passages surrounding the central gas passage. The burner has a back block defining an initial section of the gas passages, a face block defining a final section of the gas passages and a manifold plate positioned between the back block and the face block and defining an intermediate section of the external gas passages; the face block, the manifold plate and the back block have inner integral walls that define respective sections of the central gas passage.

18 Claims, 6 Drawing Sheets

US 8,001,808 B2

DISASSEMBLABLE BURNER FOR A VAPOR DEPOSITION PROCESS

CROSS REFERENCE TO RELATED APPLICATIONS

This application is a national phase application based on PCT/EP01/13701, filed Nov. 26, 2001, the content of which is incorporated herein by reference.

BACKGROUND OF THE INVENTION

1. Field of the Invention

This invention relates to a burner for a vapour deposition process, in particular for a vapour deposition process for the manufacturing of a glass preform suitable for drawing an optical fibre.

2. Description of the Related Art

As is well known, a glass preform suitable for drawing an optical fibre can be produced by one of the following methods of depositing chemical substances on a deposition substrate: MCVD (Modified Chemical Vapor Deposition), OVD (Outside Vapor Deposition) and VAD (Vapor-phase Axial Deposition). In these techniques, a burner is used to generate a flame and to eject toward the deposition substrate predetermined substances that react in the flame to form deposition substances.

The preform so formed is subsequently positioned vertically within a furnace and an optical fibre is drawn from the lower part of the preform.

For manufacturing a large number of high quality optical fibres having the same characteristics, it is important to guarantee a high repeatability in the deposition process. For example, it is important that a same burner used for successive deposition processes, or different burners used in parallel for a same deposition process or for contemporaneous deposition processes, can always provide the same performances.

Advantageously, burners comprising different components that can be disassembled to allow maintenance and cleaning operations can be used. The Applicant has observed that each time one such burner is disassembled, the successive assemblage operation can give rise to misalignment problems among the different components. These misalignments can result in structural imperfections of the burner and variations in its functionality. Moreover, the Applicant has noticed that also a burner that has been correctly assembled can show misalignments during functioning, for example due to vibrations. Therefore, high process repeatability cannot be guaranteed.

It has also been rioted that, after a burner has been used in several deposition processes, seizing up of different parts of a burner can occur, thus preventing disassembly of the burner. European Patent EP0978491 relates to a precision burner for oxidizing halide-free, silicon-containing compounds. This patent tackles the problem of variability in the properties of burners used in OVD processes, which result in a variability in the preforms produced using such burners. In particular, EP0978491 describes a prior art burner, also represented (in an exploded view) in FIG. 1 of the present patent and indicated with 10, which includes:

- a back block 16, defining a gas-receiving block, connected to reactants feed lines (not shown);
- a face block 12 (burner head), defining a gas-ejecting block, having reactants exit holes;
- a couple of manifolds 14, 20 interposed between back block and face block; and
- a separate fume tube 18 that extends through back block, manifolds and face block, and adapted to convey a reactant comprising silica up to a central exit hole of the face block.

Bolts 30, only one of which is shown in FIG. 1, are inserted through aligned bolt holes 24, 26 and 28 of back block 16, manifold plate 14 and face block 12, respectively, and tightened to hold burner 10 together.

In practice, it has been found that the positioning of inner shield manifold 20 on fume tube 18 and the alignment of face block 12, manifold plate 14, back block 16, and fume tube 18 can vary from burner to burner.

To solve these problems, EP0978491 proposes a burner with some relevant differences with respect to the above-described burner, in particular a burner having a better alignment of fume tube within back block and face block and easier to be disassembled. In particular, fume tube, back block and face block are shaped so that fume tube can be press fit into back block until it reaches a shoulder therein and so that face block can have a slide fit over fume tube. Also, in order to eliminate removable inner shield manifold 20, which was a source of substantial burner-to-burner variability for prior art burner 10, the orifices that serve to equalize the pressure of the innershield gas are formed as an integral part of fume tube.

According to the Applicant, these solutions are not completely satisfactory, since there is still the need to fit together different pieces by pressing or sliding, and both manufacturing tolerances and wear can lead to misalignment and seizing problems.

The Applicant has in particular noted that a burner like the one proposed in EP0978491 can still be subjected to misalignment between fume tube and face block, which can significantly worsen the uniformity of gas flows and the effectiveness of the reactions taking place among the different gas.

The Applicant has also observed that the same problems may be present in other burners known in the art, like the ones described in U.S. Pat. No. 4,474,593 and in U.S. Pat. No. 3,698,936, wherein there is a separate central tube that fit into other parts of the burner for defining a central gas passage.

The Applicant has tackled the problem of providing a burner for a vapour deposition process wherein said misalignment and seizing problems can be eliminated or at least significantly reduced.

SUMMARY OF THE INVENTION

The Applicant has found that a burner wherein at least the face block (i.e. the gas-ejecting block) has internal integral walls that define a final section of the central gas passage of the burner is substantially void of misalignment and seizing problems of the type previously described.

For the purposes of the present invention, the terms "integral walls" and "walls integral to each other" refer to walls that are portions of a one-piece body or walls that are rigidly coupled to each other in such a way that they cannot be disassembled.

The separate central fume tube of the prior art burners, which is the cause of said misalignment and seizing problems, is in fact eliminated. In a preferred solution, also manifold plate and back block have integral internal walls that define respective longitudinal section of the central gas passage. Advantageously, each one of the said elements may be made of a single piece and the burner may thus be formed of only three pieces rigidly connected.

This invention therefore relates to a burner for a vapour deposition process, having a central gas passage and a plurality of external gas passages surrounding the central gas passage, and comprising a gas-receiving block and a gas-ejecting block releasably coupled to each other, wherein the central gas passage and the plurality of external gas passages have respective final sections defined by walls of said gas-ejecting block that are integral to each other.

Preferably, the gas-receiving block and the gas-ejecting block have a substantially circular cross-section and are substantially coaxial to a longitudinal axis of the burner.

Moreover, in a preferred embodiment the central gas passage is substantially cylindrical and is substantially coaxial to the longitudinal axis.

The burner may further comprise an intermediate block interposed between, and releasably coupled to, the gas-receiving block and the gas-ejecting block. Preferably, the intermediate block is substantially cylindrical and substantially coaxial to said longitudinal axis.

Moreover, the intermediate block may comprise an inner integral wall defining an intermediate section of the central gas passage, and may also comprise a plurality of orifices of predetermined diameter for providing a uniform gas flow within each gas passage of said plurality of external gas passages.

The gas-receiving block may comprise an inner integral wall defining an initial section of the central gas passage.

In a different embodiment of the burner of the present invention, the gas-ejecting block has a backward tubular extension that extends through at least the intermediate block to define an intermediate section of the central gas passage. The backward tubular extension may extend also through said gas-receiving block to define an initial section of the central gas passage. In a further different embodiment, the intermediate block has a backward tubular extension that extends through the gas-receiving block to define an initial section of the central gas passage.

Moreover, as a further possible alternative, the gas-receiving block may have a forward tubular extension that extends through the intermediate block to define an intermediate section of the central gas passage.

Preferably, the gas-receiving block and the gas-ejecting block are made of metal, more preferably of aluminum.

The gas-ejecting block preferably has a substantially flat ejection face and the central gas passage and the plurality of an external gas passages preferably end at said ejection face. Preferably, inside the gas-ejecting block each gas passage of said plurality of external gas passages comprises a substantially annular duct coaxial to said longitudinal axis or a crown of orifices coaxial to said longitudinal axis.

The central gas passage is preferably defined in the ejecting block by an integral tubular wall that is supported by integral radial members.

According to a further aspect, the present invention relates to a burner for a vapour deposition process, having a longitudinal axis and consisting of a plurality of blocks and a plurality of coupling members for releasably coupling said plurality of blocks, wherein said bocks are longitudinally independent from each other. Preferably each block of said plurality of blocks define a respective longitudinal section of a plurality of gas passages.

BRIEF DESCRIPTION OF THE DRAWINGS

Further details may be found in the following description, which refers to the appended figures listed here.

DETAILED DESCRIPTION OF THE INVENTION

Figure 1:
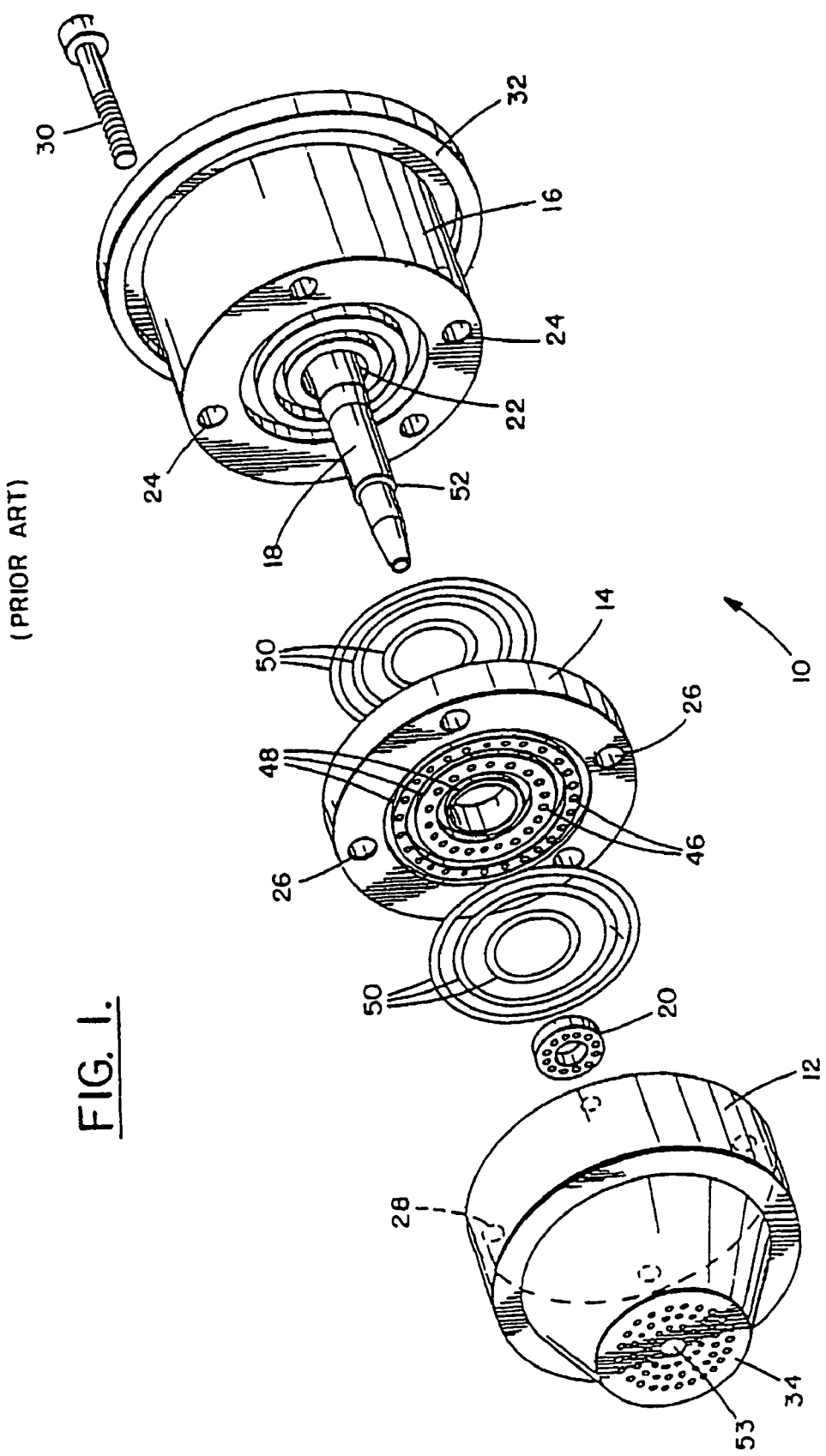
FIG. 1 is an exploded view of a prior art burner.

A process for making an optical fibre is herein below described with particular reference to a OVD process. The process comprises the following stages.

In a first stage, a plurality of chemical substances is deposited on a cylindrical mandrel (which can be held horizontally or vertically and is preferably made of alumina or other ceramic material) by means of a deposition device described hereinafter. These substances typically comprise silicon and germanium, deposited as oxides ($SiO_2$ and $GeO_2$), and they will subsequently form the core and an inner portion of the cladding of the optical fibre.

During the deposition process, the mandrel is made to rotate about its axis and the burner is reciprocated in parallel to the axis of the mandrel for a predetermined number of times and within a predetermined motion range, so as to grow a soot body of predetermined diameter and length.

During the soot deposition, the reactants flow may be varied so as to obtain a predetermined refraction index profile by a controlled deposition of the chemical substances.

The product of this first stage is a cylindrical preform of glass material, named "core preform", which will be formed into the core and an internal cladding region of the optical fibre.

In a second stage, the mandrel is extracted from the core preform, leaving a central hole therein.

In a third stage, the core preform is subjected to a process of drying and consolidation in a furnace, which comprises feeding $Cl_2$ and other gas into the central hole in order to eliminate the hydroxide ions (—OH) and the atoms of water contained in the preform. Thus a vitrified core preform is obtained, wherein the central hole has a lower diameter than in the initial core preform.

In a fourth stage, after vacuum has been created inside the central hole (as described, for example, in U.S. Pat. No. 4,810,276), the vitrified core preform is placed in a vertical furnace for melting a lower end thereof. The fused glass material is stretched downwards by a traction device forming a cylindrical elongated member of predetermined diameter. In this step, the surface tension causes the walls of the hole to collapse. Preferably, a traction device of the type described in the above mentioned patent application WO01/49616 is used, so that a twist is imparted to the elongated member during stretching, thus producing a rod-like member with a high degree of straightness (i.e. without intrinsic shape defects). After further cooling, the elongated member so produced is cut to obtain a plurality of rods, named "core rods", having a typical length of about one meter and a typical external diameter of about 10-20 mm.

In a fifth stage, each core rod is used as a substrate for a further process of vapour deposition ("overcladding") similar to the one of the first stage. This deposition process comprises depositing on the core rod a plurality of chemical substances (typically including $SiO_2$), which will subsequently form an external portion of the cladding of the optical fibre. This further deposition process can be carried out by using the same deposition device used in the first stage. The product of the fifth stage is a low-density cylindrical preform, hereinafter called "final preform".

In a sixth stage, the final preform is dried and consolidated by the same procedures as those specified for the third stage, so as to obtain a vitrified final perform.

In a seventh (and last) stage, the vitrified final perform is drawn in a known way to obtain an optical fibre.

Figure 2:
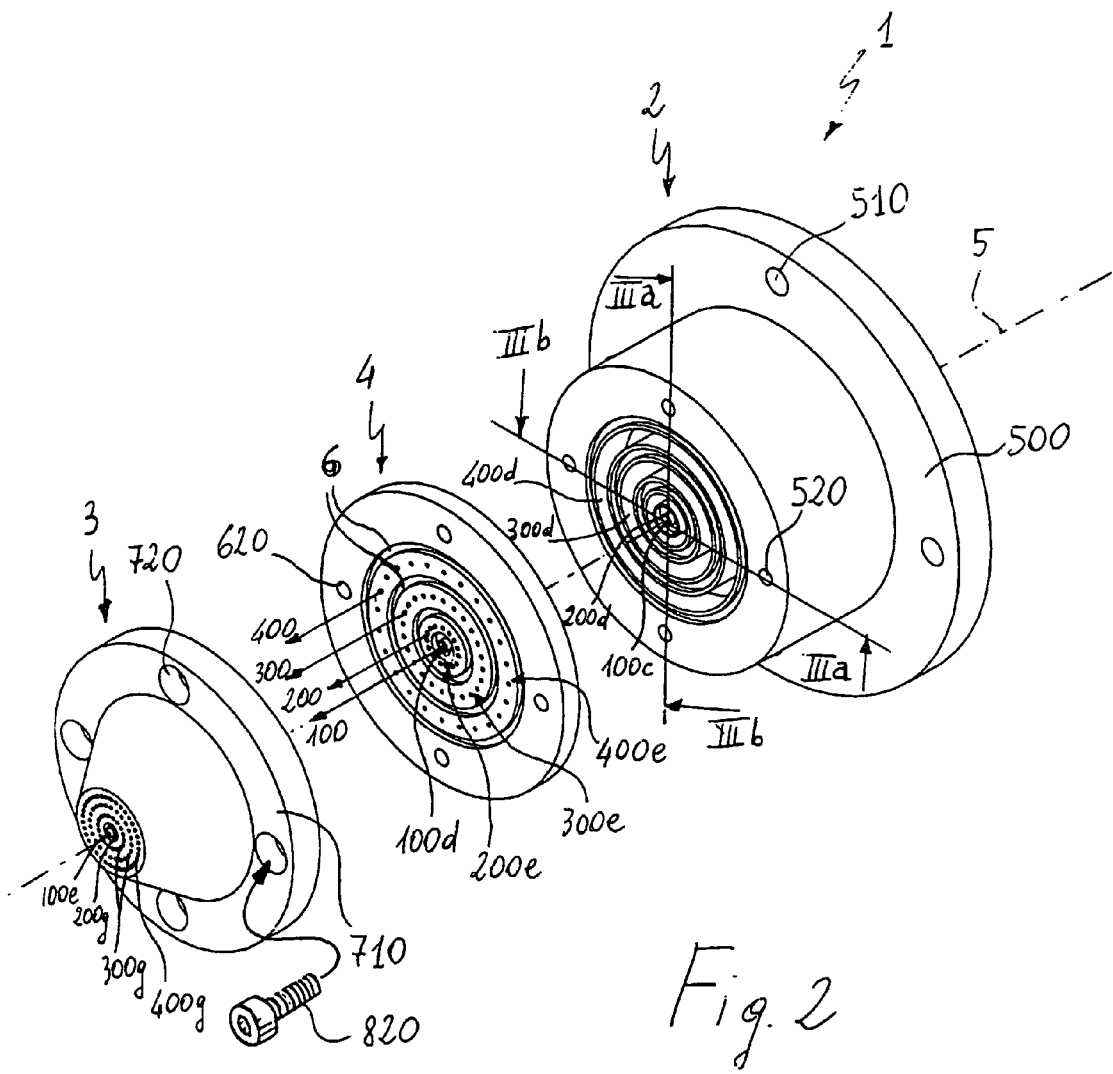
FIG. 2 is an exploded view of a burner according to the present invention.

FIG. 2 indicates, as a whole, a burner 1 suitable to be used in the first and fifth stage of the process previously described for depositing chemical substances on a rod-like member to form a glass preform. In particular, burner 1 is adapted to eject a flow of glass precursor material and to generate a flame for uniformly heating said flow, thus causing the glass precursor material to react. As a result, a flow of fine soot glass particles can be formed, which is directed onto the deposition rod to produce the glass preform.

Burner 1 comprises a back block 2 and a face block 3 releasably coupled to each other. In the present description and claims, the term "block" indicates a body whose parts are integral to each other. Back block 2 defines a gas-receiving block connected to reactants feed lines (as herein after described with reference to FIG. 6) for receiving predetermined reactants. Face block 3 defines a gas-ejecting block and has a plurality of reactants exit holes, as herein below described.

Preferably, burner 1 also comprises a manifold plate 4, which defines an intermediate block 4 interposed between back block 2 and face block 3 and releasably coupled therewith.

Blocks 2, 3 and 4 have preferably a substantially circular cross-section and are substantially coaxial to a same longitudinal axis 5. Moreover, blocks 2, 3 and 4 are preferably made of metal, more preferably of aluminum, which can be readily machined; however, other metals suitable to be machined, like stainless steel (e.g., 303 stainless steel), can alternatively be used.

For each block, back and front portions will be identified coherently with the above definition of a back block and a face block.

Burner 1 defines a plurality of passages for respective gases to be used in the deposition process; in particular, it has a central gas passage and a plurality of external gas passages surrounding the central gas passage. In the particular embodiment herein after described, burner 1 comprises a first passage 100 (FIGS. 3a and 3b), a second passage 200 (FIG. 3a), a third passage 300 (FIG. 3b) and a fourth passage 400 (FIG. 3a) suitable to convey respective flows of gas. First passage 100 is a central rectilinear and cylindrical passage coaxial to axis 5, while the other passages have a more complex extension around passage 100, as will be herein after described.

Figure 3A:
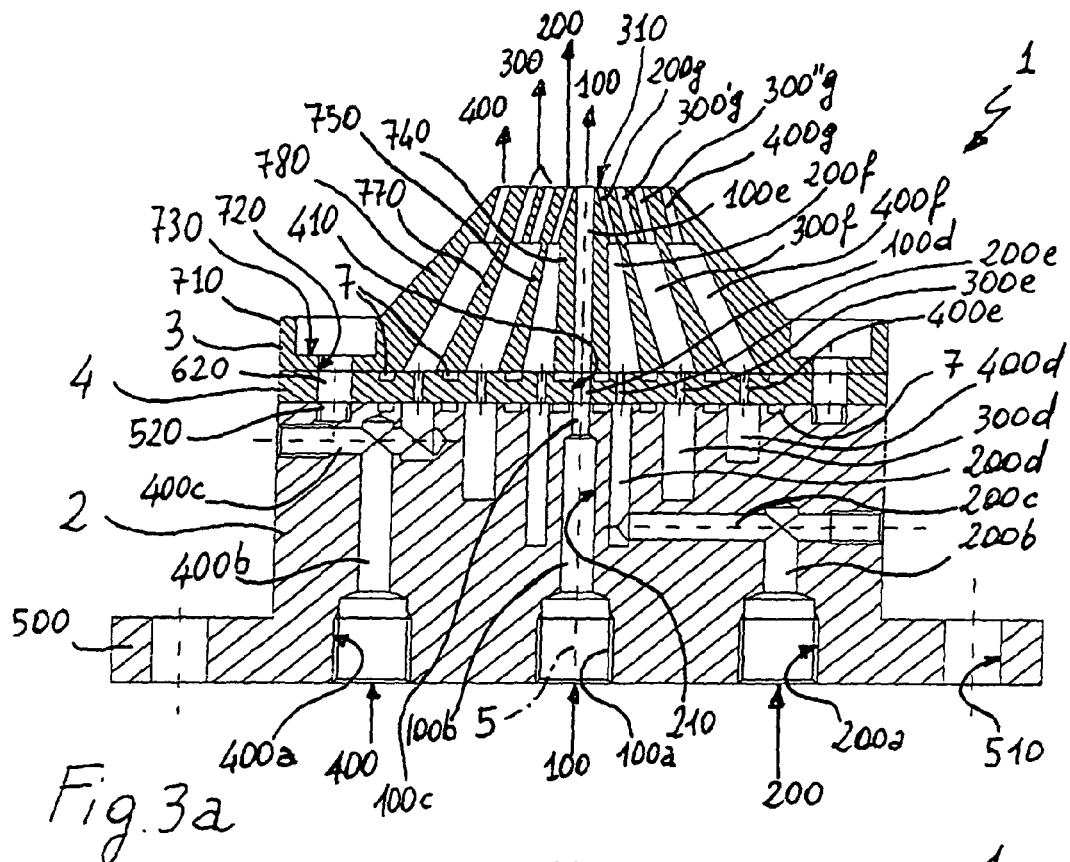
FIGS. 3*a* and 3*b* are cross-sections of the burner of FIG. 2 according to lines IIIa-IIIa and IIIb-IIIb of FIG. 2, respectively.
Figure 3B:
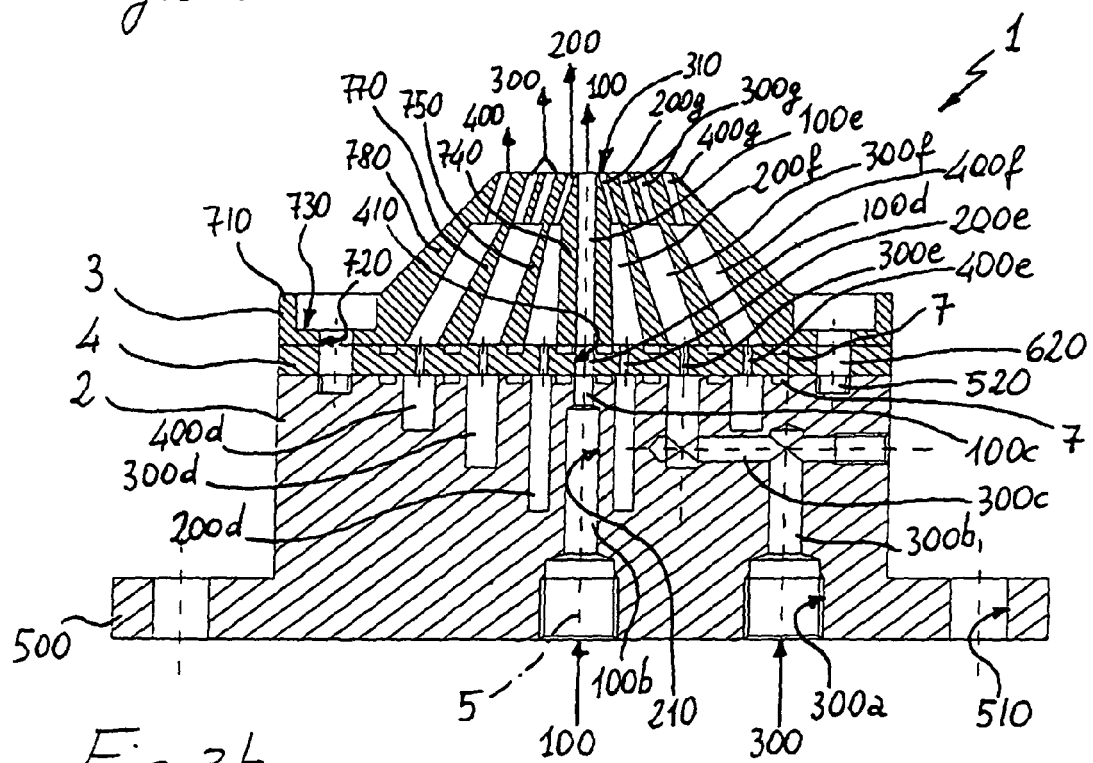

Each of said passages comprises several sections distributed in the different blocks of burner 1. With reference to FIGS. 2, 3a and 3b, back block 2 is preferably an integrally-formed body of substantially cylindrical shape, having at its base a radial flange 500 for coupling burner 1 onto a burner mounting block 520 (shown schematically in FIG. 6). For this purpose, radial flange 500 has unthreaded holes 510 (FIG. 2) for passage of coupling bolts (not shown).

Figure 4:
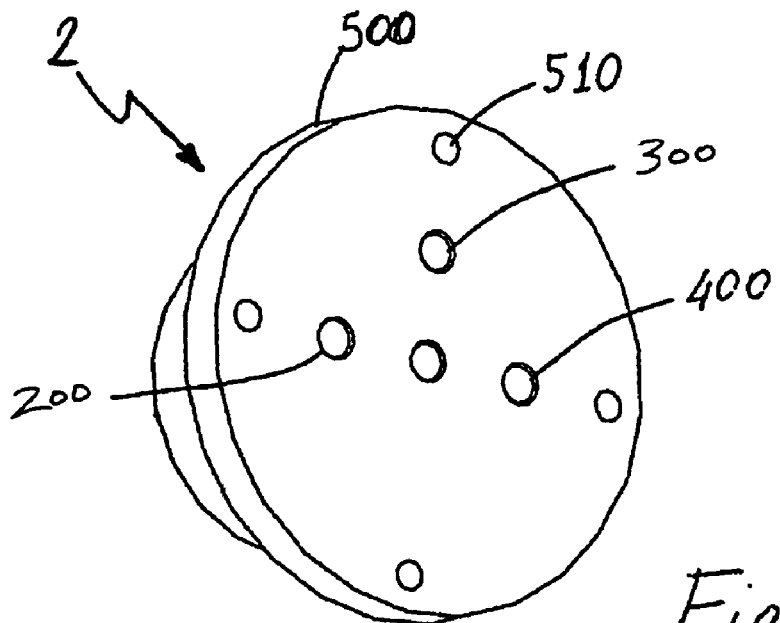
FIG. 4 is a back prospective view of a back block of the burner of FIG. 2.

As shown in FIGS. 3a, 3b and 4, back block 2 has, in its rear portion, a first, a second, a third and a fourth cylindrical entrance holes 100a, 200a, 300a, 400a substantially of the same dimensions, defining respective first sections of passages 100, 200, 300 and 400 for the inlet of gas into burner 1.

Hole 100a is coaxial to axis 5, while holes 200a, 300a and 400a have respective axes parallel to axis 5 and preferably equidistanced from axis 5, and are angularly distributed around hole 100a at predetermined angles, for example at 90° from each other as shown in FIG. 4. Holes 200a, 300a and 400a may also have different angular distributions, for example at 120° from each other, or may have different distances from hole 100a. Holes 100a, 200a, 300a, 400a are internally threaded to allow coupling of the feed lines.

Passages 100, 200, 300 and 400 have respective second sections 100b, 200b, 300b, 400b of circular cross-section, extending longitudinally from the first sections and having a lower diameter than the first sections. Second sections 100b, 200b, 300b, 400b have preferably the same diameter of ducts defined by the corresponding feed lines.

First passage 100 has a third section 100c of smaller diameter than the second section 100b for regulating the pressure of the gas flowing therein, and extending up to the front face of back block 2.

First, second and third section 100a, 100b, 100c form together (i.e. are subsections of) an initial section of first passage 100 defined by back block 2. Second sections 200b, 300b, 400b communicate, by means of corresponding third sections 200c, 300c, 400c of circular cross-section and radially converging towards axis 5, with an inner, an intermediate, and an outer annular duct 200d, 300d, 400d, respectively, all coaxial to axis 5, which define respective fourth sections of passages 200, 300 and 400. Annular ducts 200d, 300d, 400d end on the front surface of back block 2 and preferably have different longitudinal extension inside back block 2, in particular inner annular duct 200d is longer than intermediate annular duct 300d and intermediate annular duct 300d is longer than outer annular duct 400d.

Back block 2 preferably has a plurality of threaded holes 520 provided on the external portion of its front face, to make possible coupling with manifold plate 4 and face block 3. In the particular embodiment here considered, there are four holes 520 angularly spaced of 90° from each other. From the above description it can be noticed that, differently from the back block of the burner described in EP0978491, back block 2 comprises an inner integral wall, indicated with 210, which defines an initial section of the central gas passage 100.

Manifold plate 4 is preferably a disk-like body having the function of stabilizing gas pressure and providing uniform gas flows at face block 3. With reference to FIGS. 2, 3a, and 3b, manifold plate 4 has substantially the same external diameter of back block 2 and has a central hole 100d that defines a fourth—and intermediate—section of first passage 100 and continues third section 100c of back block 2 substantially with the same diameter. Manifold plate 4 also has an inner, an intermediate, and an outer crown of longitudinal orifices 200e, 300e, 400e coaxial with axis 5 and defining respective fifth sections of passages 200, 300 and 400. Distance from axis 5 of crowns of orifices 200e, 300e, 400e substantially corresponds to that of inner, intermediate and outer annular duct 200d, 300d, 400d, respectively, so as to communicate therewith. The orifices of each crown have substantially the same diameter, which is smaller than the thickness of the corresponding annular ducts 200d, 300d and 400d, for providing a uniform flow of each different gas within the respective gas passage.

In its external portion, manifold plate 4 preferably has passing holes 620 that face threaded holes 520 of back block 2.

Differently from the manifold plate of the burner described in EP0978491, manifold plate 4 comprises an inner integral wall, indicated with 410, which defines an intermediate section of the central gas passage 100. Advantageously, as shown in FIGS. 2, 3a and 3b, both back block 2 and manifold plate 4 may have, on the respective front surfaces, annular grooves 6 suitable to house respective O-rings 7, used to prevent gas leakage among the different passages of burner 1 or towards the external of burner 1. In the depicted embodiment, both back block 2 and manifold plate 4 have four annular grooves 6 and four corresponding O-rings 7 between passages 100 and 200, 200 and 300, 300 and 400, and externally to passage 400, respectively.

Preferably, as shown in FIGS. 2, 3a, 3b and 5, face block 3 has a substantially frusto-conical shape and has, at its base, a radial flange 710 having substantially the same external diameter of manifold plate 4 and back block 2. Radial flange 710 has preferably passing holes 720 that face holes 620 of manifold plate 3, thus permitting passage of threaded bolts 820 (only one of which is represented in FIG. 2). Walls of holes 720 also comprise a shoulder portion 730 (FIGS. 3a and 3b) to stop the head of bolts 820. Therefore, bolts 820 can be passed through holes 720, 620, and 520 and tightened to threaded holes 520 until the respective heads abut against shoulder portions 730, thus locking together face block 3 manifold plate 4 and back block 2.

Face block 3 has a central duct 100e defining a fifth—and final—section of first passage 100 and having substantially the same diameter of fourth section 100d in manifold plate 4. Central duct 100e is defined by a central tubular wall 740, which is an integral portion of face block 3 and preferably extends for the entire length of face block 3.

Face block 3 also has an inner, an intermediate and an outer annular duct 200f, 300f, 400f defining respective sixth sections of passages 200, 300 and 400. Annular ducts 200f, 300f, 400f converge towards axis 200 from the back surface of face block 3 and have, in the correspondence of said back surface, a distance from axis 5 that corresponds substantially to the distance from axis 5 of first, second and third crown of orifices 200e, 300e, 400e, respectively, so as to communicate therewith.

Figure 5:
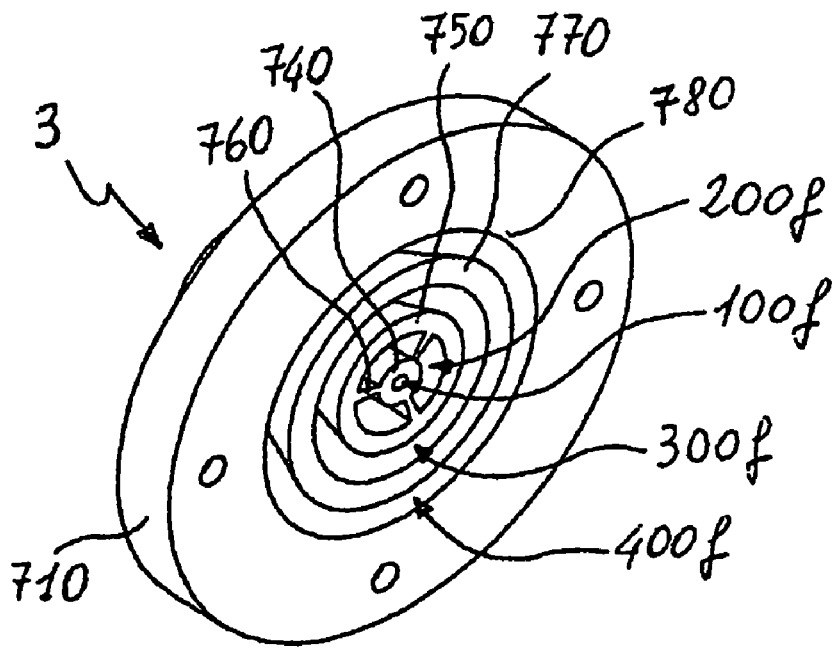
FIG. 5 is a back prospective view of a face block of the burner of FIG. 2.

Inner annular duct 200f is delimited internally by tubular wall 740 and externally by a first intermediate frusto-conical wall 750. Wall 750 is connected to central tubular wall 740 by means of radial members 760, in particular spokes, which are integral with walls 740 and 750 and transversely cross the inner annular duct 200f. As shown in FIG. 5, there may be three spokes 760 distributed at 120° from each other. Spokes 760 are preferably distributed at constant angles from each other, so that the gas flow inside the inner annular duct 200f is disturbed substantially in a uniform way. Spokes 760 may also be more than three or less than three. It is also possible to provide a single spoke 760, but this may cause undesirable variations in the uniformity of the gas flow inside annular duct 200f. As concern the shape of spokes 760, they may be straight in the radial direction, as shown in FIG. 5, or they may have a more rounded shape.

Intermediate annular duct 300f is internally delimited by first intermediate frusto-conical wall 750 and externally by a second intermediate frusto-conical wall 770. External annular duct 400f is internally delimited by second intermediate frusto-conical wall 770 and externally by an external frusto-conical wall 780, which also defines the lateral wall of frusto-conical front portion 700. Annular ducts 200f, 300f and 400f extend up to a front portion of face block 3, and they are therefrom continued by ducts 200g, 300g, 400g of smaller dimensions. Ducts 200g, 300g, 400g extend up to a front surface 310 of face block 3 and define respective seventh—and final—sections of passages 200, 300, 400. Front surface 310 is substantially flat and defines the end of central gas passage 100 and external gas passages 200, 300 and 400.

In particular, seventh section 200g is defined by an inner annular duct smaller than annular duct 200f, which converges towards axis 5 preferably with a higher angle than annular duct 200f. Seventh section 300g is defined by two coaxial crowns of orifices 300'g and 300"g, in particular an inner crown of orifices 300'g and an intermediate crown of orifices 300"g external to inner annular duct 200g. Preferably, orifices of inner and intermediate crowns 300'g, 300"g extend substantially parallel to each other and converge toward axis 5 substantially with the same angle of intermediate annular duct 300f. Seventh section 400g is defined by an outer crown of orifices external to the intermediate crown of orifices 300"g, which converge towards axis 5 preferably with a smaller angle than external annular duct 400f.

In the front portion of face block 3, central tubular wall 740 is externally tapered and is completely bordered by inner annular duct 200g. In fact, spokes 760 end before this end portion and do not extend into annular duct 200g. In this way, the disturbing effect on the gas flow produced by spokes 760 in the rear portion and in the middle portion of face block 3 is attenuated, and the flow of gas exiting the face block 3 from the second passage 200 is substantially stabilized.

The number and the arrangement of orifices 300'g, 300"g and 400g defines the fluid dynamics of the gases exiting the face block 3 from the third and fourth passages 300, 400, and may be varied according to the particular process requirements, for example as taught in EP0978491.

From the above description of burner 1, it can be appreciated that a main difference between burner 1 and the burners of the prior art previously describes is that burner 1 is void of any central tube (fume tube) to be fit with the face block, and integral walls are provided to define the central gas passage. The misalignment, assembling and disassembling problems associated with the fume tube of the prior art are therefore eliminated.

In the preferred embodiment previously described, the burner comprises blocks each made of a single piece. In particular, it is particularly advantageous to have a one-piece face block 3, although it is also possible to make the face block 3 by rigidly coupling two or more pieces (for example one including internal wall 740 and one other including the remaining part of face block 3) in such a way that they cannot be disassembled (for example by a coupling with interference).

Moreover, in the preferred embodiment the different blocks are longitudinally independent from each other. In the present description and claims, the term "longitudinally independent" referred to the blocks forming the burner means that these blocks do not superimpose in the direction defined by the axis of the burner or, in other words, that each of these blocks is void of any portion extending into another block. A burner according to the present invention may therefore consist of a plurality of longitudinally independent blocks and at least a coupling member for releasably coupling said plurality of blocks. When the burner is assembled, the different components can be easily aligned and tightened together. When the burner is disassembled, the components are easily separated without risks of seizing.

As previously stated, burner 1 is suitable to convey and eject the substances required for a OVD process. For example, the following substances can be fed to the different gas passages:

$SiCl_4$ premixed with $O_2$ to the first passage 100;
$O_2$ to the second passage 200 (to define innershield $O_2$);
$CH_4$ premixed with $O_2$ to the third passage 300; and O₂ to the fourth passage 400 (to define outershield O₂).

Figure 6:
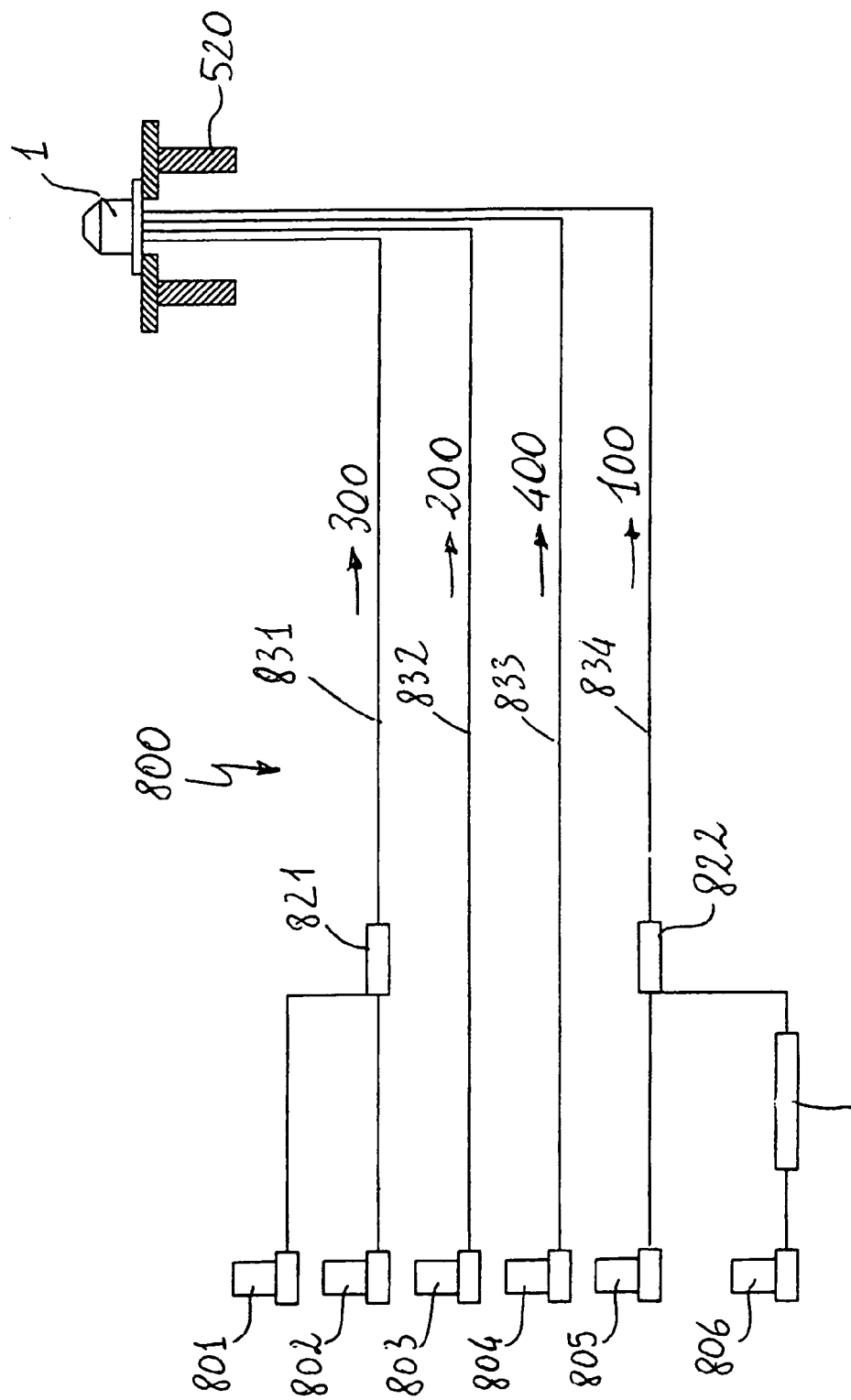
FIG. 6 shows a gas delivery assembly 800 for the burner of FIG. 2; and FIGS. from 7*a* to 7*d* illustrate further possible embodiments of the burner of the present invention.

FIG. 6 schematically illustrates a gas delivery assembly 800 for burner 1. Assembly 800 comprises regulated gas sources 801-806 of a known type, to generate the gases to be fed to burner 1. For example, assembly 800 may comprise a first gas source 801 for generating CH₄, a second gas source 802 for generating O₂ to be mixed with CH₄ before feeding to burner 1, a third gas source 803 for generating O₂ that will define an innershield O₂ into burner 1, a fourth gas source 804 for generating O₂ that will define an outershield O₂ into burner 1, a fifth gas source 805 for generating O₂ to be mixed with SiCl₄ before feeding to burner 1 and a sixth gas source 806 for generating SiCl₄. The above gases will be considered in the following, but the present arrangement is suitable, or can be easily modified so as to be suitable, for any combination of reactants known in the art for a vapour deposition by a burner. Sixth gas source 806 is connected to a vaporizer 810 suitable to vaporize the gas generated by gas source 806, in this case SiCl₄. First gas source 801 and second gas source 802 are fluidly connected to a first mixer 821 suitable to mix together the gases emitted thereby, in this case CH₄ and O₂. Similarly, fifth gas source 805 and sixth gas source 806 are fluidly connected to a second mixer 822 suitable to mix together the gases emitted thereby, in this case O₂ and SiCl₄.

Assembly 800 further comprises a first, a second, a third and a fourth gas feed line 831-834 fluidly connecting gas sources 803, 804 and mixers 821, 822 to burner 1. In particular, first feed line 831 connects first mixer 821 to third gas entrance hole 300a of burner 1; in the present case, first feed line 831 feeds CH₄ mixed with O₂ to third passage 300;

second feed line 832 connects third gas source 803 to second gas entrance hole 200a of burner 1; in the present case, second feed line 832 feeds innershield O₂ to second passage 200;

third feed line 833 connects fourth gas source 804 to fourth gas entrance hole 400a of burner 1; in the present case, third feed line 833 feeds outershield O₂ to fourth passage 400; and fourth feed line 834 connects second mixer 822 to first gas entrance hole 100a of burner 1; in the present case, fourth feed line 834 feeds O₂ and SiCl₄ mixed together to first passage 100.

It will be apparent to those skilled in the art that various modifications and variations can be made to the disclosed embodiment of the present invention without departing from the scope or spirit of the invention.

For example, it can be appreciated that the geometry of second, third and fourth passages 200, 300 and 400 is not basic, and that burner 1 may be made with different geometries and number of passages around the central passage 100.

Figure 7A:
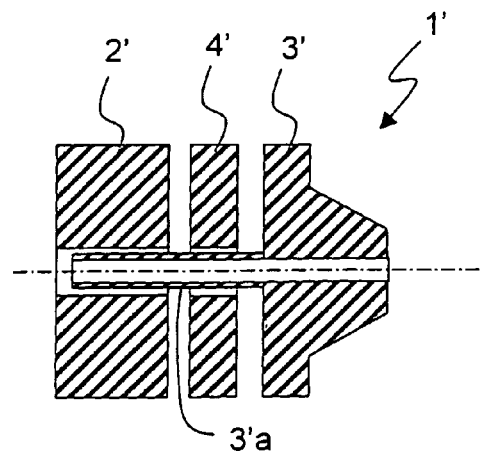
Figure 7B:
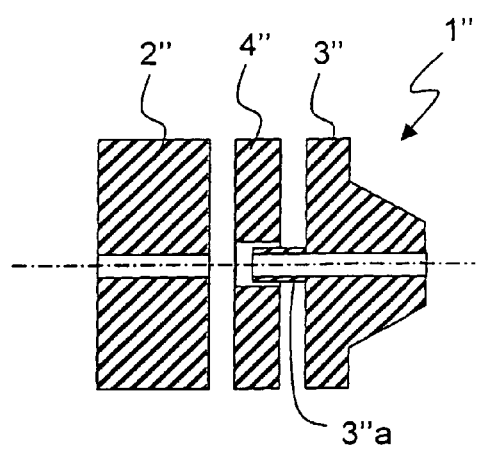
Figure 7C:
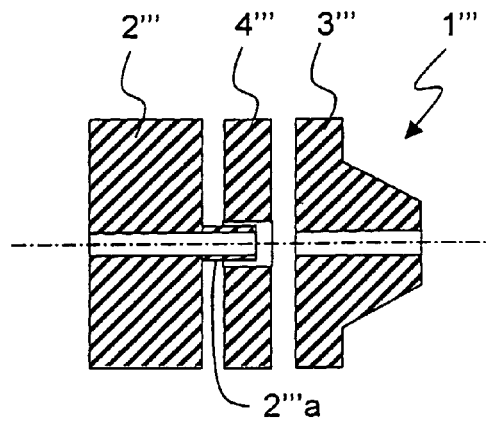
Figure 7D:
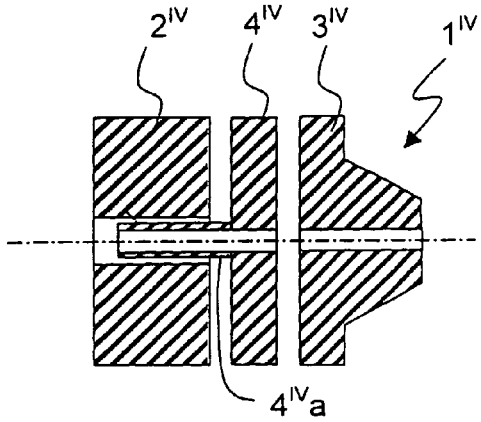

Moreover, different structural solutions are possible in connection with the realization of the walls defining the central gas passage, in particular as concern the walls that define the initial and the intermediate sections of the central passage. FIGS. from 7a to 7d illustrates four possible alternatives, in particular:

FIG. 7a illustrates a burner 1' that differs from burner 1 first in that it comprises a face block 3' having a backward tubular extension 3'a, and second because it comprises a manifold plate 4' and a back block 2' which in turn differ from manifold plate 4 and back block 2 in that they have central holes to slidably receive extension 3'a; in this case initial and intermediate sections of central passage 100 are defined by tubular extension 3'a;

FIG. 7b illustrates a burner 1" that differs from burner 1 in that it comprises a face block 3" having a backward tubular extension 3"a shorter than that of FIG. 7a, and a manifold plate 4" differing from manifold plate 4 in that it has a central hole to slidably receive extension 3"a; in this case intermediate section of central passage 100 is defined by tubular extension 3"a;

FIG. 7c illustrates a burner 1' that differs from burner 1 in that it comprises a back block 2''' having a forward tubular extension 2'''a, and a manifold plate 4''' which differs from manifold plate 4 in that it has a central hole for slidably receiving extension 2'''a; in this case intermediate section of central passage 100 is defined by extension 2'''a; and FIG. 7d illustrates a burner $1^{IV}$ that differs from burner 1 in that it comprises an intermediate plate $4^{IV}$ having a backward tubular extension $4^{IV}a$, and a back block $2^{IV}$ that differs from back block 2 in that it has a central hole to slidably receive extension $4^{IV}a$; in this case initial section of central passage 100 is defined by extension $4^{IV}$.

These embodiments, although still providing an easy and correct alignment of the different components, have the disadvantage of requiring a sliding fit of at least one piece into one other.

What is claimed is:

1. A burner for a vapour deposition process, the burner having a longitudinal axis and comprising:
   a gas-receiving block and a gas-ejecting block releasably coupled to each other;
   said gas-receiving block being longitudinally independent from the gas-ejecting block;
   the gas-receiving block and the gas-ejecting block each having a wall defining respective sections of a central gas passage extending substantially coaxially along the longitudinal axis and a plurality of external gas passages surrounding the central gas passage;
   the wall of the central gas passage defined in the gas-receiving block defining a first, a second, and a third section of said central gas passage,
   wherein the first, second, and third sections of said central gas passage defined in the gas-receiving block extend substantially coaxially along the longitudinal axis.

2. The burner of claim 1 wherein the gas-receiving block and the gas-ejecting block have a substantially circular cross-section and are substantially coaxial to the longitudinal axis of said burner.

3. The burner of claim 2, further comprising an intermediate block interposed and releasably coupled to the gas-receiving block and the gas-ejecting block.

4. The burner of claim 3, wherein the intermediate block is substantially cylindrical and substantially coaxial to said longitudinal axis.

5. The burner of claim 4, wherein said gas-receiving block has a forward tubular extension that extends through said intermediate block to define an intermediate section of said central gas passage.

6. The burner of claim 3, wherein said intermediate block comprises an inner integral wall defining an intermediate section of said central gas passage.

7. The burner of claim 3, wherein said intermediate block comprises a plurality of orifices of predetermined diameter for providing a uniform gas flow within each gas passage of said plurality of external gas passages.

8. The burner of claim 3, wherein said gas-ejecting block has a backward tubular extension that extends through at least said intermediate block to define an intermediate section of said central gas passage.

9. The burner of claim 1, wherein the central gas passage is substantially cylindrical and is substantially coaxial to said longitudinal axis.

10. The burner of claim 1, wherein said gas-receiving block and said gas-ejecting block are made of metal.

11. The burner of claim 10, wherein said gas-receiving block and said gas-ejecting block are made of aluminum.

12. The burner of claim 1, wherein said gas-ejecting block has a substantially flat ejection face and wherein said central gas passage and said plurality of external gas passages end at said ejection face.

13. The burner of claim 1, wherein inside said gas-ejecting block, each gas passage of said plurality of external gas passages comprises a substantially annular duct coaxial to said longitudinal axis or a crown of orifices coaxial to said longitudinal axis.

14. The burner of claim 1, wherein said central gas passage is defined in said gas-ejecting block by an integral tubular wall supported by integral radial members.

15. A burner for a vapour deposition process, having a longitudinal axis and comprising:
    a gas-receiving block and a gas-ejecting block, the gas-receiving block being longitudinally independent from the gas-ejecting block;
    each of said blocks having a wall defining respective sections of a central gas passage extending substantially coaxially along the longitudinal axis and a plurality of external gas passages surrounding the central gas passage;
    the wall of the central gas passage defined in the gas-receiving block defining a first, a second, and a third section of said central gas passage,
    wherein the first, second, and third sections of said central gas passage defined in the gas-receiving block extend substantially coaxially along the longitudinal axis.

16. A burner for a vapour deposition process, the burner having a longitudinal axis and comprising:
    a gas-receiving block and a gas-ejecting block releasably coupled to each other;
    said gas-receiving block being longitudinally independent from the gas-ejecting block;
    the gas-receiving block and the gas-ejecting block each having a wall defining respective sections of a central gas passage extending substantially coaxially along the longitudinal axis and a plurality of external gas passages surrounding the central gas passage, the respective sections of the central gas passage extending substantially coaxially along the longitudinal axis of the burner,
    wherein the burner is void of any central tube fitted with the gas-ejecting block.

17. A burner for a vapour deposition process, the burner having a longitudinal axis and comprising:
    a gas-receiving block and a gas-ejecting block releasably coupled to each other;
    said gas-receiving block being longitudinally independent from the gas-ejecting block;
    the gas-receiving block and the gas-ejecting block each having a wall defining respective sections of a central gas passage extending substantially coaxially along the longitudinal axis and a plurality of external gas passages surrounding the central gas passage;
    the wall of the central gas passage defined in the gas-receiving block defining a first, a second and a third section of said central gas passage,
    wherein:
        the second section of said central gas passage defined in the gas-receiving block extends longitudinally and substantially coaxially along the longitudinal axis from the first section and has a lower diameter than the first section; and
        the third section of said central gas passage defined in the gas-receiving block extends longitudinally and substantially coaxially along the longitudinal axis from the second section and has a lower diameter than the second section for regulating the pressure of a gas flowing therein.

18. A burner for a vapour deposition process, having a longitudinal axis and comprising:
    a gas-receiving block and a gas-ejecting block;
    the gas-receiving block being longitudinally independent from the gas-ejecting block;
    each of said blocks having a wall defining respective sections of a central gas passage extending substantially coaxially along the longitudinal axis and a plurality of external gas passages surrounding the central gas passage;
    at least part of the wall of the central gas passage defined in the gas-receiving block defining a first, a second and a third section of said central gas passage,
    wherein:
        the second section of said central gas passage defined in the gas-receiving block extends longitudinally and substantially coaxially along the longitudinal axis from the first section and has a lower diameter than the first section; and
        the third section of said central gas passage defined in the gas-receiving block extends longitudinally and substantially coaxially along the longitudinal axis from the second section and has a lower diameter than the second section for regulating the pressure of a gas flowing therein.

* * * * *